(12) United States Patent
Andreas

(10) Patent No.: US 6,936,540 B2
(45) Date of Patent: Aug. 30, 2005

(54) METHOD OF POLISHING A SEMICONDUCTOR SUBSTRATE, POST-CMP CLEANING PROCESS, AND METHOD OF CLEANING RESIDUE FROM REGISTRATION ALIGNMENT MARKINGS

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/664,744

(22) Filed: Sep. 18, 2003

(65) Prior Publication Data

US 2005/0064712 A1 Mar. 24, 2005

(51) Int. Cl.[7] .................... H01L 21/302; H01L 21/461
(52) U.S. Cl. .................. 438/690; 438/692; 216/89
(58) Field of Search .................. 438/690, 692; 216/89; 427/595; 156/345.11, 345.12

(56) References Cited

U.S. PATENT DOCUMENTS

| | | | |
|---|---|---|---|
| 5,855,811 A | 1/1999 | Grieger et al. | 252/79.3 |
| 6,044,851 A | 4/2000 | Grieger et al. | 134/1.3 |
| 6,099,662 A * | 8/2000 | Wang et al. | 134/26 |
| 6,265,781 B1 | 7/2001 | Andreas | 257/765 |
| 6,269,511 B1 | 8/2001 | Andreas et al. | 15/77 |
| 6,273,100 B1 | 8/2001 | Andreas et al. | 134/1.3 |
| 6,358,325 B1 | 3/2002 | Andreas | 134/2 |
| 6,375,548 B1 | 4/2002 | Andreas | 451/41 |
| 6,468,951 B1 | 10/2002 | Grieger et al. | 510/175 |
| 6,527,870 B2 * | 3/2003 | Gotkis | 134/6 |
| 6,589,882 B2 | 7/2003 | Andreas et al. | 438/745 |
| 6,627,550 B2 | 9/2003 | Andreas | 438/691 |
| 6,635,186 B1 * | 10/2003 | Small et al. | 216/88 |
| 6,635,562 B2 | 10/2003 | Andreas | 438/633 |
| 6,787,473 B2 | 9/2004 | Andreas | 438/692 |
| 6,835,121 B2 | 12/2004 | Andreas | 451/41 |
| 6,835,668 B2 | 12/2004 | Andreas et al. | 438/745 |
| 2001/0046774 A1 * | 11/2001 | Sommer | 438/692 |
| 2003/0143857 A1 | 7/2003 | Andreas | 438/710 |
| 2004/0058546 A1 * | 3/2004 | Hall et al. | 438/692 |

OTHER PUBLICATIONS

S. Wolf & R. Tauber, Silicon Processing for the VLSI Era, vol. 1: Process Technology, pp. 137 and 761–764 (2000).

* cited by examiner

Primary Examiner—George Fourson
Assistant Examiner—Fernando L. Toledo
(74) Attorney, Agent, or Firm—Wells St. John P.S.

(57) ABSTRACT

A post-CMP cleaning process includes brush cleaning a CMPed surface, followed by at least partially drying the CMPed surface, followed by spray cleaning the CMPed surface. A method of cleaning residue from registration alignment markings formed on a semiconductor substrate includes polishing a material within which the registration alignment markings are received with a polishing solution comprising a liquid and a solid, followed by brush cleaning a remaining outermost polished surface, followed by at least partially drying the polished surface, followed by spray cleaning the outermost polished surface. Other aspects and implementations are contemplated.

60 Claims, 2 Drawing Sheets

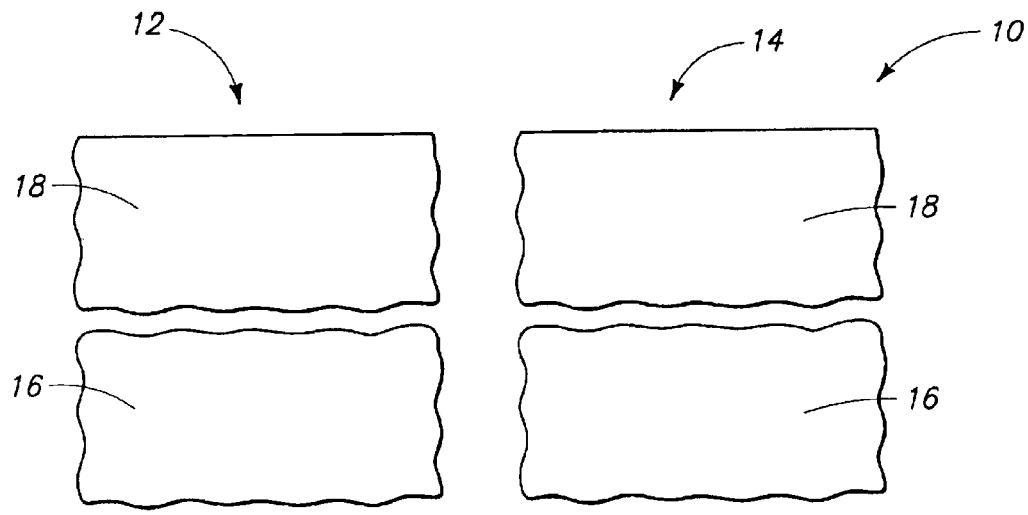
$\mathit{F\,I\,G.\,1}$
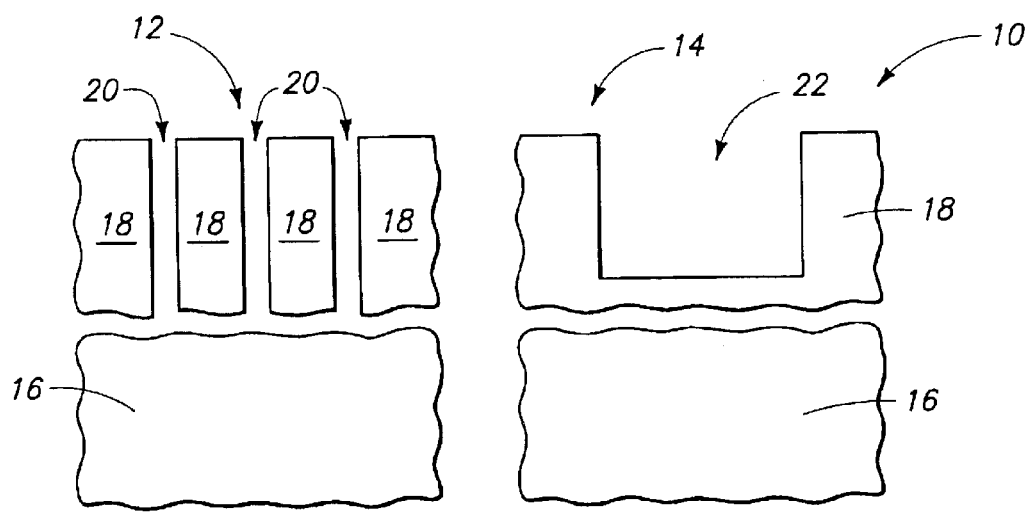
$\mathit{F\,I\,G.\,2}$

METHOD OF POLISHING A SEMICONDUCTOR SUBSTRATE, POST-CMP CLEANING PROCESS, AND METHOD OF CLEANING RESIDUE FROM REGISTRATION ALIGNMENT MARKINGS

TECHNICAL FIELD

This invention relates to methods of processing semiconductor substrates (including methods of polishing), to methods of cleaning registration alignment markings formed on semiconductor substrates, and to post-CMP cleaning processes.

BACKGROUND OF THE INVENTION

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such typically includes deposition of a patternable masking layer commonly known as photoresist. Such materials can be processed to modify their solubility in certain solvents, and are thereby readily usable to form patterns on a substrate. For example, portions of a deposited photoresist layer can be exposed to actinic energy through openings in a mask or reticle to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresists and/or a combination of photoresists with non-radiation sensitive masking materials are utilized.

Regardless, it is important in photolithographic processing that the various masks or reticles utilized be very precisely aligned relative to the substrate being processed. This is typically conducted in part by forming some sort of alignment registration markings on the substrate being processed. Accordingly, the mask or reticle is precisely aligned relative to such markings on the substrate immediately prior to processing the resist layer utilizing the mask or reticle.

The alignment registration marks are typically fabricated on areas of the substrate which will not be utilized for fabricating operable circuitry. In one example, a series of such marks are patterned about a peripheral-most region of the substrate being processed. Alternately by way of example only, the alignment registration markings might be fabricated in street or scribeline area between individual die. Regardless, the alignment registration markings are typically several regions of a plurality of parallel trenches which are formed within the substrate. These markings are also typically fabricated commensurate with fabricating operable circuitry elsewhere on the substrate.

In DRAM circuitry fabrication, one exemplary place where these alignment marks are fabricated is commensurate with deep, narrow contact openings which are fabricated through one or more dielectric layers to ultimately make electrical connection with bit lines, word lines, or other conductive regions underlying the insulative material. In present generation processing, these contact openings might be only 0.15 micron wide, and of roughly the same length. Alignment registration markings are typically quite larger, for example, with individual trenches having an exemplary width of 1.2 microns and an exemplary length of 20 microns.

The contact openings are ultimately filled with some suitable conductive material, for example tungsten with or without conductive barrier layer materials. The conductive material is deposited to a thickness sufficiently thick to fill the contact openings but insufficiently thick to fill the alignment registration markings. Accordingly, such markings are typically lined with the conductive material and not completely filled therewith.

The typical manner by which the excess conductive material is removed to form isolated conductive contacts within the contact openings is by chemical mechanical polishing. Such utilizes a slurry having liquid and solid components which is polished against the outer substrate surface using a rotating pad. The conductive material is accordingly chemically and mechanically abraded away from the outer surface at least to the insulative material therebeneath, thereby forming isolated conductive contacts to circuitry regions beneath the insulative layer.

A continuing challenge with chemical mechanical polishing is cleaning of the substrate subsequent to the polishing. In the above-described environment, a solid particulate slurry material can become lodged within the alignment registration markings and can be difficult to remove. Various cleaning techniques have been developed, with most including utilizing cleaning solutions with or without soft brush scrubbing of the outer polished surface. Yet it has been found in the above-described environment, particulate contamination can still be problematic utilizing conventional cleaning techniques such as brush cleaning, or with independent immersion or plasma cleaning techniques.

While the invention was principally motivated in addressing the above issues, it is in no way so limited. The invention is only limited by the accompanying claims as literally worded, without interpretative or other limiting reference to the specification, and in accordance with the doctrine of equivalents.

SUMMARY

This invention includes methods of processing semiconductor substrates (including methods of polishing semiconductor substrates), methods of cleaning registration alignment markings formed on semiconductor substrates, and post-CMP cleaning processes.

In one implementation, a post-CMP cleaning process includes brush cleaning a CMPed surface, followed by at least partially drying the CMPed surface, followed by spray cleaning the CMPed surface.

In one implementation, a method of cleaning residue from registration alignment markings formed on a semiconductor substrate includes polishing a material within which the registration alignment markings are received with a polishing solution comprising a liquid and a solid, followed by brush cleaning a remaining outermost polished surface, followed by at least partially drying the polished surface, followed by spray cleaning the outermost polished surface.

In one implementation, a method of polishing a semiconductor substrate includes polishing a semiconductor substrate using a polishing solution comprising a liquid and a solid. After such polishing, a remaining outermost polished surface of the semiconductor substrate is cleaned with a first cleaning solution and a brush effective to remove at least some of the polishing solution from the outermost polished surface. After the brush cleaning, the outermost polished surface is at least partially dried. After the drying, the outermost polished surface is spray cleaned with a second cleaning solution.

Other aspects and implementations are contemplated.

BRIEF DESCRIPTION OF THE DRAWINGS

Preferred embodiments of the invention are described below with reference to the following accompanying drawings.

FIG. 1 is a diagrammatic, cross-sectional, fragmentary view of a semiconductor substrate in process in accordance with an aspect of the invention.

FIG. 2 is a view of the FIG. 1 wafer fragment at a processing step subsequent to that shown by FIG. 1.

DETAILED DESCRIPTION OF THE PREFERRED EMBODIMENTS

Figure 3:
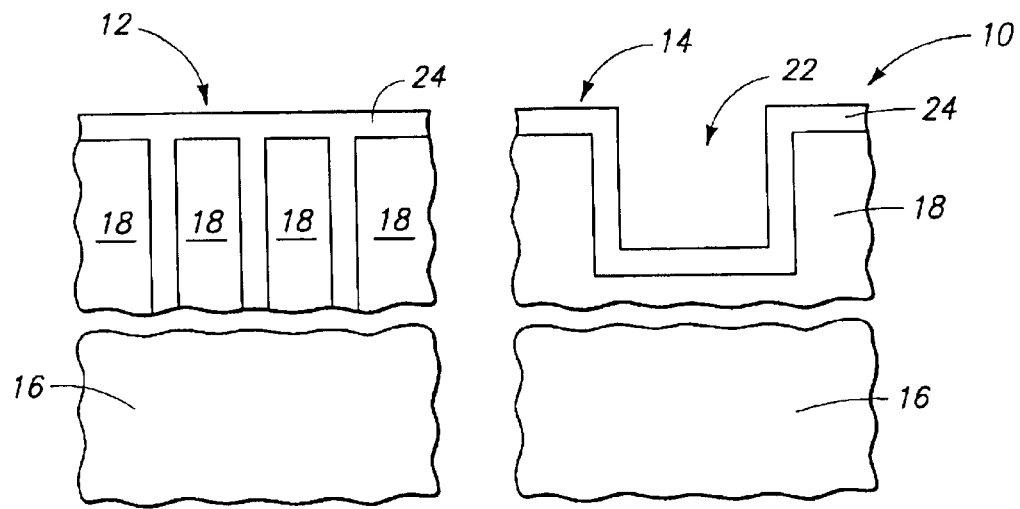
FIG. 3 is a view of the FIG. 2 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

One preferred method of processing a semiconductor substrate in accordance with some aspects of the invention is described with reference to FIGS. 1–4. FIG. 1 depicts a semiconductor substrate 10 comprised of two regions 12 and 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural. By way of example only for purposes of the continuing discussion, region 12 constitutes some region within which operable circuitry will be fabricated, while region 14 will be utilized to fabricate alignment registration markings which likely will not contain operable circuitry.

Substrate 10 includes some base substrate material 16 which may constitute one or more layer or layers of insulative, conductive, and/or semiconductive materials which might be homogenously or non-homogenously distributed. An exemplary preferred material is bulk monocrystalline silicon. A dielectric layer 18 is formed over semiconductor substrate 16. Exemplary preferred materials are silicon dioxides, for example borophosphosilicate glass.

Referring to FIG. 2, contact openings 20 are formed into dielectric layer 18, as are alignment registration markings 22 using some common masking step and at least one common etching step to the formation of said openings. For example, and by way of example only, the depicted opening patterning can be conducted utilizing a photolithographic mask or reticle in combination with photoresist to form outlines within the photoresist for openings 20 and 22 in a single photolithographic masking step. This could be followed by at least one common anisotropic etching of dielectric material layer 18 to produce depicted openings 20 and 22. Of course, dielectric layer 18 might include one or more additional layers, for example an etch stop layer within region 14 for stopping the etch of opening 22 to define the illustrated base of such opening.

Referring to FIG. 3, a conductive material/layer 24 has been formed over dielectric layer 18 to within contact openings 20 and to within registration markings 22. An exemplary preferred material is elemental tungsten. Alternate materials could of course be utilized in combination or to the exclusion of elemental tungsten, and including one or more conductive barrier layers. In the depicted exemplary embodiment, material 24 is deposited to a thickness effective to completely fill, and overfill, openings 20, yet only partially fill alignment registration markings 22.

Figure 4:
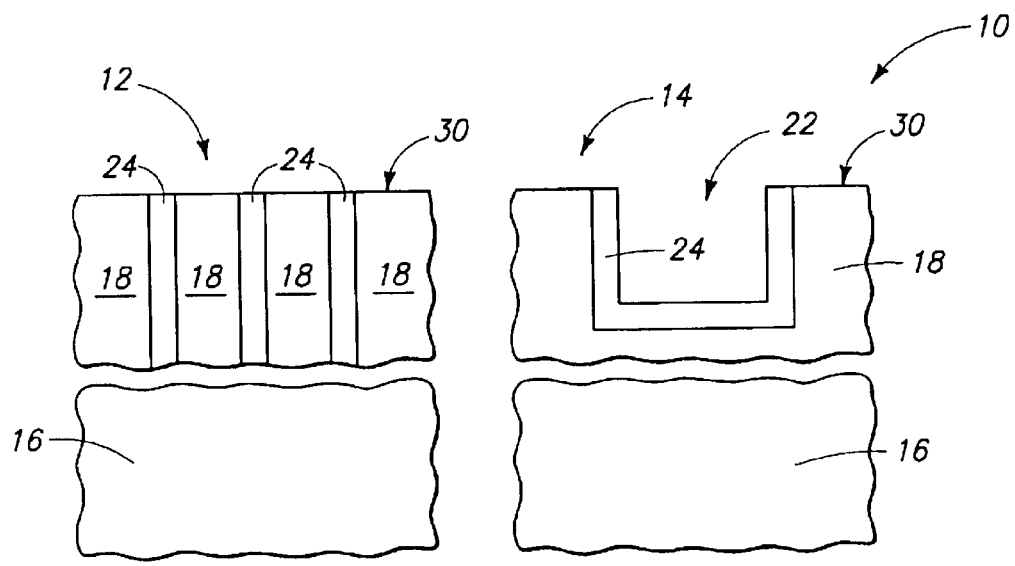
FIG 4 is a view of the FIG. 3 wafer fragment at a processing step subsequent to that shown by FIG. 3.

Referring to FIG. 4, conductive material 24 has been polished through to dielectric layer 18 using a polishing solution comprising a liquid and a solid. Accordingly, material 18 comprises some outer surface 30 which has also been exposed to the polishing action and solution. Material 18 may or may not be appreciably removed by the polishing action depending on the selectivity of the polishing relative thereto, but nevertheless constitutes a material within which registration alignment markings are received which has been polished due to its exposure to the polishing solution and action.

The preferred polishing action is chemical mechanical polishing, although other polishing actions (whether existing or yet-to-be developed) are also contemplated. The polishing solution and action utilized can be tailored or selected by the artisan depending on the material or materials being removed or polished, including using existing prior art polishing techniques and slurries. In reduction to practice examples, the material polished was elemental tungsten, with the dielectric layer material being borophosphosilicate glass. The polishing action was by chemical mechanical polishing utilizing Mirra equipment available from Applied Materials, Inc. of Santa Clara, Calif., and using an MSW-2000 polishing slurry available from Rodel, Inc. of Phoenix, Ariz. Such polishing was conducted, by way of example only, under room ambient temperature and pressure conditions but for elevated temperature at the surface being polished due to the polishing action.

After polishing, the remaining outermost polished surface (including surface 30 of the dielectric material and the exposed surfaces of the conductive material) are cleaned with a first cleaning solution and a brush effective to remove at least some of the polishing solution from the outermost polished surface; The brush may or may not physically contact the substrate as in existing brush cleaning. Regardless, any existing brushing action and any existing or yet-to-be developed cleaning solution could be utilized, including 100 percent water. Exemplary more preferred existing cleaning solutions include 600 ppm tetramethyl ammonium hydroxide in deionized water, and deionized water containing from about 0.1 percent to 0.5 percent by weight $NH_3$. Any existing or yet-to-be developed brush cleaning is contemplated. The invention was reduced to practice utilizing a Dai Nippon screen (DNS) AS2000 post-CMP scrubbing tool.

After the brush cleaning, the outermost polished surface is at least partially dried. More preferably, the outermost polished surface is completely dried after the brush cleaning. Regardless, the drying action might occur in conjunction with any existing or yet-to-be developed method. For example in one embodiment, such drying might be conducted by exposure of the substrate to room ambient temperature and pressure conditions for a suitable time to appreciably dry the surface. Alternately by way of example only, the drying might comprise exposing the outermost polished surface to subatmospheric pressure. Further by way of example only, the drying might include raising a temperature of the semiconductor substrate from what ambient temperature was during the polishing to some suitable higher temperature. For example, the polishing might be conducted substantially at room ambient temperature conditions but for elevated temperature at the substrate surface the result of the polishing action. The elevated temperature exposing during the drying might be advantageously conducted at temperatures higher than room ambient, for example at 100° C. or higher. Other drying techniques include, by way of example only, exposing the outermost polished surface to infrared heating lamps, for example at atmospheric pressure, sub-atmospheric pressure, or pressure elevated from atmospheric pressure, as well as furnace drying at any suitable temperature and pressure.

One preferred drying technique comprises exposing the outermost polished surface to a plasma. One preferred plasma comprises nitrogen and hydrogen components, for example as might be derived from an $NH_3$ atmosphere, and/or an atmosphere containing $H_2$ and $N_2$. Such plasma exposing preferably comprises a temperature of at least 100° C. and a pressure of no greater than 100 Torr. An exemplary preferred reduction to practice drying example included a plasma bake at 250° C. in a 5 to 20 liter microwave plasma chamber powered at 2000 Watts for an 8-inch wafer for one minute. Pressure during such processing was 1 Torr in forming gas ($H_2$ at 4 volume percent and $N_2$ at 96 volume percent), which was flowed to the plasma chamber at a rate of 1000 sccm. The chamber was a FusionES3 microwave plasma processor available from Axcelis of Beverly, Mass., although of course any alternate existing or yet-to-be developed plasma processor might also be utilized. Another exemplary drying technique utilizing such chamber used $NH_3$ at 5,000 sccm, 340° C., 1. Torr pressure for one minute.

After the drying, the outermost polished surface is spray cleaned with a second cleaning solution. The second cleaning solution might be the same in composition as the first cleaning solution, or be different in composition from the first cleaning solution. The invention was reduced to practice using a "Soft Spray" nebulizing spray module available from Dai Nippon Screen (DNS) of Kyoto, Japan installed on the above DNS AS2000 post-CMP scrubbing tool. Such equipment comprises a cleaning nozzle provided at from 5 to 10 millimeters above the wafer, and from which the second cleaning solution was sprayed with an inert gas such as $N_2$. One reduction-to-practice example utilized the above referred to 600 ppm tetramethyl ammonium hydroxide in deionized water. Such reduction-to-practice spraying was conducted for 60 seconds at ambient room temperature and room pressure conditions.

In one implementation, a preferred elevated temperature during the drying is also preferably higher than an ambient temperature utilized during the spray cleaning. Further, in one preferred implementation, the processing is preferably void of any fluid spraying onto the outermost polished surface intermediate the above-stated polishing and the cleaning with the brush and first cleaning solution. In one preferred implementation, the processing is void of any fluid spraying onto the outermost polished surface intermediate the cleaning with the brush and first cleaning solution and the drying.

In one preferred implementation, the drying is effective to reduce remaining particulate contamination on the outermost polished surface after the spray cleaning than would otherwise occur in the absence of the drying. The invention was motivated in achieving this effect, although certain aspects of the invention are in no way so limited.

Processing as exemplified above resulted in reduction-to-practice examples of significantly reduced contaminated surfaces than using other methods. For example, less than complete or desirable cleaning can result from processing generally as described in the "Background" section of this document. One known prior art technique of reducing CMP slurry removal problems is to initially fill the trenches with photoresist immediately prior to conducting the chemical mechanical polishing processing step. This was conducted in conjunction with the "Background" section description method. However, processing as described above in accordance with the invention resulted in lower contamination, and thereby a cleaner surface than utilizing the photoresist process.

Another method which was tried to alleviate or reduce particulate contamination included spray cleaning the substrate immediately after the brush scrubbing but without any intermediate dedicated drying, for example utilizing the same brush scrubbing solution or a different solution. However, such did not result in any appreciable improvement in reduction of particle contamination than merely conducting such post-CMP scrubbing without subsequent spray cleaning.

Significant improvement over both of these above-described other processes occurred in conducting a drying of the outermost surface after brush cleaning, followed by subsequent spray cleaning.

It is not entirely understood what actions are occurring by the drying that results in the preferred embodiment effect of reducing remaining particulate contamination on the outermost polished surface after the spray cleaning than would otherwise occur in the absence of the drying. It has not been determined whether the drying action is principally a cleaning effect with respect to one or more of the liquid solutions, the solid grit material from the chemical mechanical polishing slurry, material of the chemical mechanical polishing pad that dislodges onto the substrate being polished, or some combination of these or others. Without being limited to any theory of the invention in its broadest aspects, it has been discerned that the polishing action can leave material of the polishing pad itself on the substrate, for example within the alignment marking openings. This pad material that is dislodged from the polishing pad into the alignment marking openings might be a significant or at least contributing factor in the residue remaining on the substrate after the post-CMP cleaning processes. It is believed that the drying after the brush scrubbing and prior to spray cleaning results in or is effective to substantially dehydrate and in the process reduce the size of the pad material residue such that it is more easily removed by the subsequent spray cleaning action.

The invention was motivated in addressing the problems as identified above in the "Background" section of this document. However, the invention is in no way so limited and is expected to have applicability outside of the preferred embodiment aspects as described above, and regardless of whether the stated drying is effective to reduce remaining particulate contamination on the outermost polished surface after a subsequent spray cleaning would otherwise occur in the absence of the drying. Further in one aspect, the invention contemplates any method of cleaning residue from registration alignment markings formed on a semiconductor substrate which includes at least polishing a material within which the registration alignment markings are received with a polishing solution comprising a liquid and a solid, followed by brush cleaning a remaining outermost polished surface, followed by at least partially drying the polished surface, followed by spray cleaning the outermost polished surface, and independent of any processing which might or might not occur therebetween. Other exemplary preferred attributes are as described above and claimed herein.

Further as stated above, the invention is not limited to chemical mechanical polishing, although certain preferred aspects of the invention are specific to cleaning processes associated with chemical mechanical polished (CMPed) surfaces. For example in one aspect, the invention contemplates any post-CMP cleaning process which at least includes brush cleaning a CMPed surface, followed by at least partially drying the CMPed surface, followed by spray cleaning the CMPed surface, and independent of any processing which might or might not occur therebetween. Other exemplary preferred attributes of such an exemplary preferred process are as described above and claimed herein.

Further in one implementation, the invention contemplates a method of polishing a semiconductor substrate which comprises polishing a semiconductor substrate using a polishing solution comprising a liquid and a solid. After such polishing, the remaining outermost polished surface of the semiconductor substrate is cleaned with a first cleaning solution and a brush effective to remove at least some of the polishing solution from the outermost polished surface. After such brush cleaning, the outermost polished surface is at least partially dried. After the drying, the outermost polished surface is spray cleaned with a second cleaning solution. Preferred attributes are as described above and claimed herein, of course including being independent of alignment registration markings being formed and/or independent of chemical mechanical polishing action and by way of example only.

Drying of semiconductor substrates post-CMP polishing prior to or as part of the cleaning process is believed to be counter-intuitive to existing teachings. For example, existing teachings are that spray rinsing should be done as soon as the wafers are lifted from the polishing pad. If wafers are exposed to air for even one or two minutes before such spraying, it has been stated that subsequent cleaning becomes difficult and perhaps impossible, presumably because of dried slurry buildup, for example as described by Wolf and Tauber, Silicon Processing for the VLSI Era Volume I—Process Technology, Second Edition, Lattice Press (2000) pp. 137 and 761–764.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of polishing a semiconductor substrate, comprising:

polishing a semiconductor substrate using a polishing solution comprising a liquid and a solid;

after said polishing, cleaning a remaining outermost polished surface of the semiconductor substrate with a first cleaning solution and a brush effective to remove at least some of the polishing solution from the outermost polished surface;

after the brush cleaning, at least partially drying the outermost polished surface; and after the drying, spray cleaning the outermost polished surface with a second cleaning solution.

2. The method of claim 1 wherein the polishing comprises chemical mechanical polishing.

3. The method of claim 1 wherein said at least partially drying comprises completely drying the outermost polished surface.

4. The method of claim 1 wherein the drying comprises exposing the outermost polished surface to subatmospheric pressure.

5. The method of claim 1 wherein the drying comprises raising a temperature of the semiconductor substrate from what ambient temperature was during the polishing.

6. The method of claim 5 wherein said at least partially drying comprises completely drying the outermost polished surface.

7. The method of claim 5 wherein the raised temperature is also higher than an ambient temperature during the spray cleaning.

8. The method of claim 5 wherein said at least partially drying comprises completely drying the outermost polished surface, and the raised temperature is also higher than an ambient temperature during the spray cleaning.

9. The method of claim 5 wherein the drying comprises exposing the outermost polished surface to subatmospheric pressure.

10. The method of claim 5 wherein the drying comprises exposing the outermost polished surface to infrared heating lamps.

11. The method of claim 5 wherein the drying comprises exposing the outermost polished surface to infrared heating lamps at atmospheric pressure.

12. The method of claim 5 wherein the drying comprises exposing the outermost polished surface to a plasma.

13. The method of claim 12 wherein the plasma exposing comprises a temperature of at least 100° C. and no greater that 100 Torr pressure.

14. The method of claim 12 wherein the plasma comprises nitrogen and hydrogen.

15. The method of claim 14 wherein the nitrogen and hydrogen are derived from a gas comprising $NH_3$.

16. The method of claim 14 wherein the nitrogen and hydrogen are derived from $H_2$ and $N_2$.

17. The method of claim 1 being void of any fluid spraying onto the outermost polished surface intermediate said polishing and said cleaning with the brush and first cleaning solution.

18. The method of claim 1 being void of any fluid spraying onto the outermost polished surface intermediate said cleaning with the brush and first cleaning solution and the drying.

19. The method of claim 1 being void of any fluid spraying onto the outermost polished surface intermediate said polishing and said cleaning with the brush and first cleaning solution, and being void of any fluid spraying onto the outermost polished surface intermediate said cleaning with the brush and first cleaning solution and the drying.

20. The method of claim 1 wherein the drying is effective to reduce remaining particulate contamination on the outermost polished surface after the spray cleaning than would otherwise occur in the absence of the drying.

21. The method of claim 1 wherein the polishing occurs with a polishing pad that leaves material of the pad on the substrate, the drying being effective to substantially dehydrate and reduce size of said material of the pad on the substrate.

22. The method of claim 1 wherein the first and second cleaning solutions are common in composition.

23. The method of claim 1 wherein the first and second cleaning solutions are different in composition.

24. A post-CMP cleaning process comprising brush cleaning a CMPed surface, followed by at least partially drying the CMPed surface, followed by spray cleaning the CMPed surface.

25. The method of claim 24 wherein said at least partially drying comprises completely drying the CMPed surface.

26. The method of claim 24 wherein the drying comprises exposing the CMPed surface to subatmospheric pressure.

27. The method of claim 24 wherein a substrate is chemical mechanical polished, the drying comprises raising a temperature of the substrate from what ambient temperature was during the chemical mechanical polishing.

28. The method of claim 27 wherein said at least partially drying comprises completely drying the CMPed surface.

29. The method of claim 27 wherein the raised temperature is also higher than an ambient temperature during the spray cleaning.

30. The method of claim 27 wherein said at least partially drying comprises completely drying the outermost polished surface, and the raised temperature is also higher than an ambient temperature during the spray cleaning.

31. The method of claim 27 wherein the drying comprises exposing the CMPed surface to subatmospheric pressure.

32. The method of claim 27 wherein the drying comprises exposing the CMPed surface to infrared heating lamps.

33. The method of claim 27 wherein the drying comprises exposing the CMPed surface to infrared heating lamps at atmospheric pressure.

34. The method of claim 27 wherein the drying comprises exposing the CMPed surface to a plasma.

35. The method of claim 34 wherein the plasma comprises nitrogen and hydrogen.

36. The method of claim 34 wherein the plasma exposing comprises a temperature of at least 100° C. and no greater that 100 Torr pressure.

37. The method of claim 24 being void of any fluid spraying onto the CMPed surface intermediate chemical mechanical polishing and the brush cleaning.

38. The method of claim 24 being void of any fluid spraying onto the CMPed surface intermediate the brush cleaning and the drying.

39. The method of claim 24 being void of any fluid spraying onto the CMPed surface intermediate chemical mechanical polishing and the brush cleaning, and being void of any fluid spraying onto the CMPed surface intermediate the brush cleaning and the drying.

40. The method of claim 24 wherein the drying is effective to reduce remaining particulate contamination on the CMPed surface after the spray cleaning than would otherwise occur in the absence of the drying.

41. The method of claim 24 wherein a polishing pad is utilized during CMP, the CMP with the polishing pad leaving material of the pad on the CMPed surface, the drying being effective to substantially dehydrate and reduce size of said material of the pad on the substrate.

42. A method of cleaning residue from registration alignment markings formed on a semiconductor substrate comprising polishing a material within which the registration alignment markings are received with a polishing solution comprising a liquid and a solid, followed by brush cleaning a remaining outermost polished surface, followed by at least partially drying the polished surface, followed by spray cleaning the outermost polished surface.

43. The method of claim 42 wherein the polishing comprises chemical mechanical polishing.

44. The method of claim 42 wherein said at least partially drying comprises completely drying the outermost polished surface.

45. The method of claim 42 wherein the drying comprises exposing the outermost polished surface to sub-atmospheric pressure.

46. The method of claim 42 wherein the drying comprises raising a temperature of the semiconductor substrate from what ambient temperature was during the polishing.

47. The method of claim 46 wherein said at least partially drying comprises completely drying the outermost polished surface.

48. The method of claim 46 wherein the raised temperature is also higher than an ambient temperature during the spray cleaning.

49. The method of claim 46 wherein said at least partially drying comprises completely drying the outermost polished surface, and the raised temperature is also higher than an ambient temperature during the spray cleaning.

50. The method of claim 46 wherein the drying comprises exposing the outermost polished surface to subatmospheric pressure.

51. The method of claim 46 wherein the drying comprises exposing the outermost polished surface to infrared heating lamps.

52. The method of claim 46 wherein the drying comprises exposing the outermost polished surface to infrared heating lamps at atmospheric pressure.

53. The method of claim 46 wherein the drying comprises exposing the outermost polished surface to a plasma.

54. The method of claim 53, wherein the plasma comprises nitrogen and hydrogen.

55. The method of claim 53 wherein the plasma exposing comprises a temperature of at least 100° C. and no greater that 100 Torr pressure.

56. The method of claim 42 being void of any fluid spraying onto the outermost polished surface intermediate said polishing and said brush cleaning.

57. The method of claim 42 being void of any fluid spraying onto the outermost polished surface intermediate said brush cleaning and the drying.

58. The method of claim 42 being void of any fluid spraying onto the outermost polished surface intermediate said polishing and said brush cleaning, and being void of any fluid spraying onto the outermost polished surface intermediate said brush cleaning and the drying.

59. The method of claim 42 wherein the drying is effective to reduce remaining particulate contamination on the outermost polished surface after the spray cleaning than would otherwise occur in the absence of the drying.

60. The method of claim 42 wherein the polishing occurs with polishing pad that leaves material of the pad on the substrate, the drying being effective to substantially dehydrate and reduce size of said material of the pad on the substrate.

* * * * *

UNITED STATES PATENT AND TRADEMARK OFFICE
CERTIFICATE OF CORRECTION

PATENT NO. : 6,936,540 B2  Page 1 of 1
DATED : August 30, 2005
INVENTOR(S) : Micheal T. Andreas It is certified that error appears in the above-identified patent and that said Letters Patent is hereby corrected as shown below:

<u>Column 4,</u>
Line 54, replace "polished surface; The brush may or may not physically" with
-- polished surface. The brush may or may not physically --.

<u>Column 10,</u>
Line 61, replace "with polishing pad that leaves material of the pad on the" with -- with a polishing pad that leaves material of the pad on the --.

Signed and Sealed this

Thirteenth Day of June, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,936,540 B2 | Page 1 of 1 |
| APPLICATION NO. | : 10/664744 | |
| DATED | : August 30, 2005 | |
| INVENTOR(S) | : Michael T. Andreas | |

It is certified that error appears in the above-identified patent and that said Letters Patent is hereby corrected as shown below:

Col. 4, line 54 -
  Replace "polished surface; The brush may or may not physically"
  With --polished surface. The brush may or may not physically--

Col. 10, line 61 -
  Replace "with polishing pad that leaves material of the pad on the"
  With --with a polishing pad that leaves material of the pad on the--

Signed and Sealed this

Fourth Day of July, 2006

JON W. DUDAS
*Director of the United States Patent and Trademark Office*